United States Patent [19]

Tsaur et al.

[11] Patent Number: 4,670,088
[45] Date of Patent: Jun. 2, 1987

[54] LATERAL EPITAXIAL GROWTH BY SEEDED SOLIDIFICATION

[75] Inventors: Bor-Yeu Tsaur, Arlington; John C. C. Fan, Chestnut Hill; Michael W. Geis, Acton, all of Mass.

[73] Assignee: Massachusetts Institute of Technology, Cambridge, Mass.

[21] Appl. No.: 828,601

[22] Filed: Feb. 11, 1986

Related U.S. Application Data

[63] Continuation of Ser. No. 359,284, Mar. 18, 1982, abandoned, which is a continuation-in-part of Ser. No. 254,871, Apr. 16, 1981, Pat. No. 4,371,421.

[51] Int. Cl.$^4$ .............................................. C30B 19/00
[52] U.S. Cl. ..................... 156/617 R; 156/DIG. 64; 148/DIG. 134; 29/576 T
[58] Field of Search ............... 156/617 R, DIG. 64, 156/DIG. 80; 148/171, 176, DIG. 134; 29/576 T; 427/53.1; 357/237 F

[56] References Cited

U.S. PATENT DOCUMENTS

| | | | |
|---|---|---|---|
| 4,214,918 | 7/1980 | Gat et al. | 427/53.1 |
| 4,269,631 | 5/1981 | Anantha et al. | 427/53.1 |
| 4,335,198 | 6/1982 | Hanada et al. | 427/53.1 |
| 4,381,201 | 4/1983 | Sakurai | 357/23 |
| 4,383,883 | 5/1983 | Mizutani | 156/603 |

FOREIGN PATENT DOCUMENTS 56-23781 3/1981 Japan .

Primary Examiner—William R. Dixon, Jr.
Assistant Examiner—Robert Bruce Breneman
Attorney, Agent, or Firm—Hamilton, Brook, Smith & Reynolds

[57] ABSTRACT

An improved method and apparatus for crystallizing amorphous or polycrystalline material is disclosed. In this invention, a material which is to be crystallized is formed on a substrate and single crystalline seed material is disposed in contact and/or adjacent to or with at least a portion of the material which is to be crystallized. A layer of material which serves as a "wetting agent" is then formed over the material to be crystallized. The structure thus formed is subjected to a heat treatment which melts the material being crystallized and when the material solidifies its crystalline structure is substantially epitaxial based on the seed material. The "wetting agent" layer serves to prevent deleterious balling up of the material during crystallization.

17 Claims, 27 Drawing Figures

LATERAL EPITAXIAL GROWTH BY SEEDED SOLIDIFICATION

RELATED APPLICATION

This is a continuation of Ser. No. 359,284 filed on Mar. 18, 1982 now abandoned; which is a continuation-in-part of Ser. No. 254,871 filed Apr. 16, 1981 now issued as U.S. Pat. No. 4,371,421 issued Feb. 1, 1983.

GOVERNMENT SUPPORT

Work described herein was supported by the U. S. Air Force.

TECHNICAL FIELD

This invention is in the field of materials, and more particularly relates to the conversion of amorphous or polycrystalline materials, such as sheets of semiconductor material, to sheets of substantially single-crystal semiconductor material.

BACKGROUND ART

Much of modern technology makes use of thin solid films on the surfaces of solid substrates. A number of methods have been used to deposit such thin films including thermal evaporation, DC sputtering, rf sputtering, ion beam deposition, chemical vapor deposition, plating, molecular beam deposition and deposition from the liquid phase.

The structure of thin films can be amorphous (that is, the atoms of the film are not arranged in any crystalling order), polycrystalline (that is, the film is composed of many small regions, in each of which the atoms are arranged in a regular crystalline order, but the small regions have no mutual alignment of their crystallographic axes), preferred orientation (that is, the film is composed of many small regions, in each of which the atoms are arranged in a regular crystalline order, and one or more of the crystalline axes of the majority of said regions are parallel), or epitaxial (that is, the film is predominantly of a single crystallographic orientation). An epitaxial or single crystal film is a special case of a preferred orientation film in which corresponding crystallographic axes of all the small regions are essentially oriented in the same directions. A thin film can be the same material (that is, the same element or compound) as the substrate, or it can differ in chemical composition from the substrate. If the film is epitaxial, the former is called "homoepitaxy" and the latter "heteroepitaxy".

In many solid state electronic devices, the active volume of the device comprises or lies within a thin sheet, film or layer of crystalline semiconductor material, preferably in the single crystal or monocrystalline form. This active volume is formed on an insulative substrate. This is particularly true of integrated circuits formed from semiconductors such as gallium arsenide, silicon, germanium, indium phosphide, cadmium telluride, etc. Present techniques for fabricating such devices, however, require that the crystalline sheets or films be grown mainly by chemical vapor deposition from the surface of relatively thick substrates of high-purity, single crystal semiconductor material, such as sapphire. The use of such substrates for each sheet produced tends to inordinately increase the cost of producing the thin sheets. Furthermore, the high defect density of the epitaxial sheets or films thus formed and the high dielectric constant of the sapphire limits the performance of the resulting device.

Another alternative has been to form large grain sheets or films using a scanned laser beam to heat an amorphous or polycrystalline sheet or film of semiconductor material, such as Si, which has been deposited on sapphire or fused silica ($SiO_2$). See, for example, U.S. Pat. No. 4,059,461. Small grains, less than 50 microns in size, are obtained by this process and the film when overlayed on $SiO_2$ has a tendency to crack. When processed on sapphire, the Si film may interact detrimentally with the sapphire.

Another recent innovation in the growth of epitaxial films is described in a paper entitled "Silicon Graphoepitaxy Using a Strip-Heater Oven" by M. W. Geis, D. A. Antoniadis, D. J. Silversmith, R. W. Mountain and Henry I. Smith. *Appl. Phys. Lett.* 37(5) Sept. 1, 1980 which relates to the conversion of amorphous silicon to a silicon mosaic film by graphoepitaxy with a film or "cap" of $SiO_2$ over the silicon film. This process is also described in copending U.S. patent application Ser. No. 181,102 filed Aug. 25, 1980 and entitled "Graphoepitaxy by Encapsulation" (now abandoned), continuation Ser. No. 332,553 filed Dec. 21, 1981 (now abandoned), continuation Ser. No. 680,237 filed Dec. 10, 1984 (now U.S. Pat. No. 4,565,599).

The graphoepitaxy process requires the intentional creation of artificial surface relief steps or point defects in a geometric pattern on a substrate to control in a predetermined way the process of film formation and growth on the substrate. The geometric pattern is generally a simple grating or grid, oriented to promote crystal growth in a predetermined manner.

In the graphoepitaxy process, the substrate crystal orientation plays a passive role in the formation of the crystal orientation and growth which is determined primarily by the surface relief structure.

As reported on page 455 of the referenced *Appl. Phys. Lett.* even with a "cap", if the silicon film is fully melted in a graphoepitaxial process, neither texture or orientation of the crystallized film is observed. Apparently, the function of the $SiO_2$ cap in the graphoepitaxy process is to produce a shear stress as a result of thermal expansion differences between Si and $SiO_2$ which leads to anisotropy in the Si such that upon crystallization a (100) texture and uniform orientation relative to the relief gratings occurs.

Also, recently in copending U.S. patent application Ser. No. 138,891 filed Apr. 10, 1980 (now abandoned) and incorporated in continuation-in-part application Ser. No. 251,214 filed Apr. 6, 1981, there is disclosed a method of achieving lateral epitaxial growth by seeded solidification (melting and refreezing of amorphous Si) through openings in an insulator formed on a crystallization substrate. After the growth is discontinued, the sheet of crystalline material is cleaved or otherwise separated from its substrate which may optionally be reused. This process we shall refer to for the sake of convenience as the CLEFT process and the application, and the CLEFT application.

While the CLEFT process is believed to represent a significant advance over the state-of-the-art at the time the invention was made; certain problems have arisen in the application of the CLEFT invention to the consistent production of high quality, defect free, epitaxial films. More specifically, if for any reason, the lateral epitaxial growth is discontinuous, then further epitaxial growth is precluded since the further growth has no crystalline orientation to start from and will therefore grow in random polycrystalline fashion. Accordingly, a need exists for a method and apparatus for minimizing discontinuities in epitaxial films laterally grown through openings in an insulative mask formed on a crystallization substrate.

We have also found that where lateral growths meet, i.e., when lateral growth in one direction encounters lateral growth from another direction, dislocation defects are apt to occur; presumably caused by the strain or stress created when two crystallization fronts meet.

For these and other reasons, it would be highly desirable to have a process and apparatus for producing lateral epitaxial growth in amorphous semiconductor material wherein discontinuities in growth and crystal dislocations are minimized and which is relatively simple in operation and low in cost.

DISCLOSURE OF THE INVENTION

In the apparatus of the present invention, transformation of amorphous or polycrystalline semiconductor material to epitaxial material is achieved using a layer of wetting agent material which preferably has a melting point higher than the crystallization temperature of the material being transformed. This wetting agent layer is disposed in contact with the semiconductor material to be transformed. The semiconductor material is also in contact and/or adjacent with a single crystal seed material. By "wetting agent" is meant a substance or composition that causes the spreading of the semiconductor material out and over an underlying or overlying intimately contacting surface. While the precise nature of the phenomena associated with this wetting agent layer is not entirely understood, at present, we are of the opinion that this layer serves to prevent the semiconductor material from agglomerating (beading or balling up) as the crystalline front propagates laterally during epitaxial growth.

Agglomeration or "balling up" of the semiconductor material during the growth process is to be avoided since it results in voids or discontinuities in the film or layer. Once a void occurs, epitaxial growth; which is predicted on continuity with the seed, is interrupted.

It should be emphasized that the function of the wetting agent layer of the present invention is fundamentally different and distinct from the "cap" referenced in the prior art graphoepitaxy process. In the present invention, the primary purpose of the wetting agent layer is to wet the surfaces between the material to be crystallized and the seed material. The seed material is the principle determinant of the resultant crystalline properties. On the other hand, the graphoepitaxy "cap" is intended, not as a "wetting agent", but to actively contribute to the crystalline orientation and textural properties of the grown material.

In one embodiment of the invention, the growth is achieved from a seed which is not a part of the substrate as in the aforementioned CLEFT process. A "seed" is a body of single-crystal semiconductor material from which the epitaxial growth originates. However, unlike the embedded or buried single crystal material in the CLEFT process, an externally seeded growth is achieved from a body of single-crystal growth material which is provided on an external face or surface of the amorphous material which is being transformed to single-crystal material. In the external seed embodiment it is unnecessary to make openings in insulative layers to reach the underlying single crystal seed material. Furthermore, growth can be achieved by starting at the external seed and propogating the crystallization front in one direction along the surface of the amorphous material. In this and other embodiments to be described, the crystallization front does not encounter a crystallization front propagating from the opposite direction, as in the case of parallel adjacent stripe openings, and potential crystal dislocations caused by such an encounter are avoided.

BEST MODE OF CARRYING OUT THE INVENTION

The following description generally relates to silicon semiconductor epitaxial growth and silicon is selected since silicon is the most important semiconductor material in use today. However, the invention is in no way intended to be limited thereby. In fact, the invention will have beneficial application in the epitaxial growth of other well known semiconductor material such as gallium arsenide and germanium to name a few.

A variety of specific embodiments of this invention will now be illustrated with reference to the Figures. In these Figures, like elements have been given like numerals.

Figure 1:
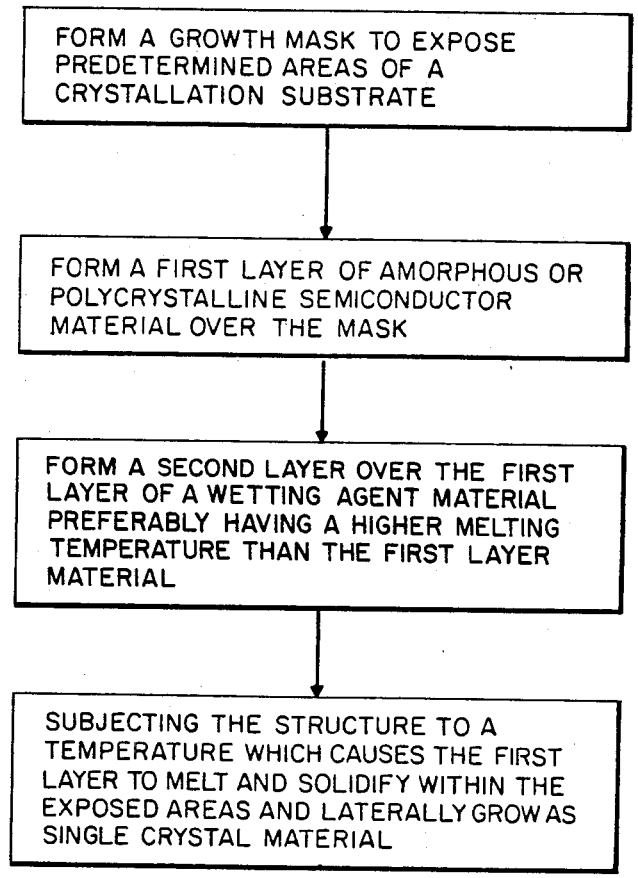
FIG. 1 is a process flow diagram for one embodiment of a process according to this invention.

FIG. 1 is a process flow sheet presenting the steps for one embodiment of this invention. In the first step of this process, a crystal growth mask is formed on a crystallization substrate to cover portions of the substrate and to leave a pattern of exposed substrate areas. The crystallization substrate can be a single crystal substrate, such as a single crystal of silicon, germanium, gallium arsenide or other semiconductor, or any other substrate capable of supporting crystal growth on at least some exposed area of the surface. The growth mask is formed from a material which will inhibit nucleation on the growth mask itself but will permit crystalline growth laterally from exposed areas.

In the next step of this embodiment, amorphous or polycrystalline semiconductor material is deposited over the mask and exposed areas of the substrate. This might be done, for example, by placing the masked substrate in a chemical vapor deposition reactor.

After the first layer of amorphous semiconductor material has been formed, a second layer is formed of a suitable wetting agent material. This second layer should preferably have a higher melting temperature than the first layer. For example, if the first layer is amorphous silicon, the second layer may comprise $SiO_2$. The respective melting points of these materials are $Si \cong 1430°$ C. and for $SiO_2 \cong 1700°$ C.

Next, the structure is subjected to a heating cycle by any of several methods to be described in detail later whereby the first layer is caused to melt and then solidify. As it solidifies, single crystal growth is initiated at areas exposed by the mask and lateral epitaxial overgrowth occurs.

FIG. 2 presents a series of views which schematically illustrate the production of a continuous thin sheet of mono-crystalline material on a crystallization substrate according to the process of FIG. 1.

Figure 2A:
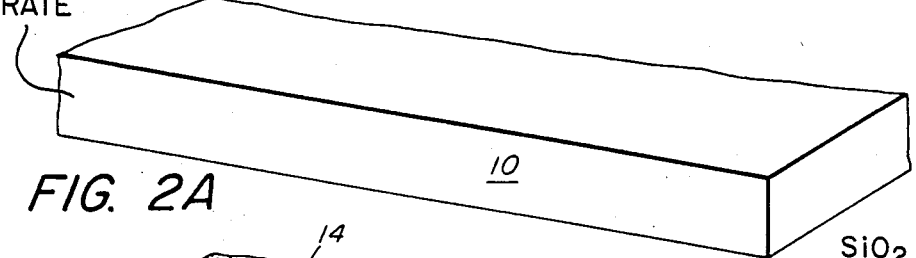
FIG. 2 A thru D presents a series of schematic views illustrating a first embodiment of the invention according to the process shown in FIG. 1.

In FIG. 2A, relatively thick crystallization substrate 10 is shown. This subtrate can be any material capable of supporting crystal growth thereon. As a typical example of a substrate suitable for growing single crystal silicon thereon, substrate 10 might be a slab of single crystal Si in the range of 5-50 mils thick and might be doped or undoped. If the crystalline film produced is to be separated by cleavage, it is preferred, although not essential, that substrate 10 have an orientation so that the surface of substrate 10 lies in a plane which is a preferential cleavage plane for the substrate material.

Figure 2B:
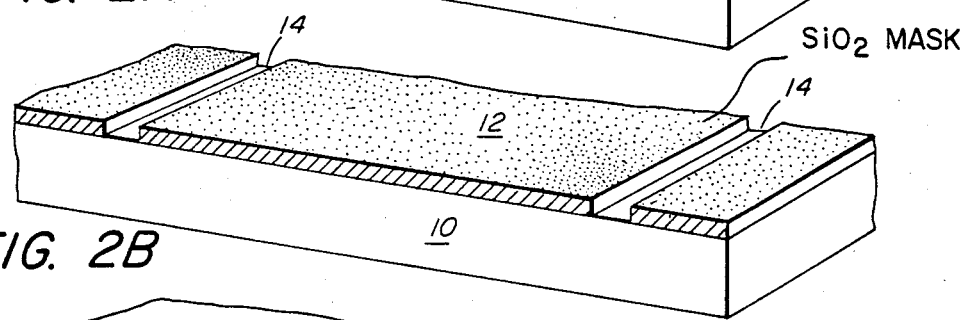

As shown in FIG. 2B, crystal growth mask 12 is then applied to substrate 10. Mask 12 has a pattern of openings through which substrate 10 is exposed. One typical pattern found to be suitable is a pattern of slits or stripes 14 as shown in FIG. 2B. The ratio of width to spacing for slits 14 can be widely varied depending upon the materials, growth conditions, required layer thickness, separation techniques employed, etc., and the optimum ratio, which depends on the particular application, can be determined by methods described in detail in the CLEFT application. Of course, growth masks having patterns of exposed areas other than slits can also be employed.

Figure 2C:
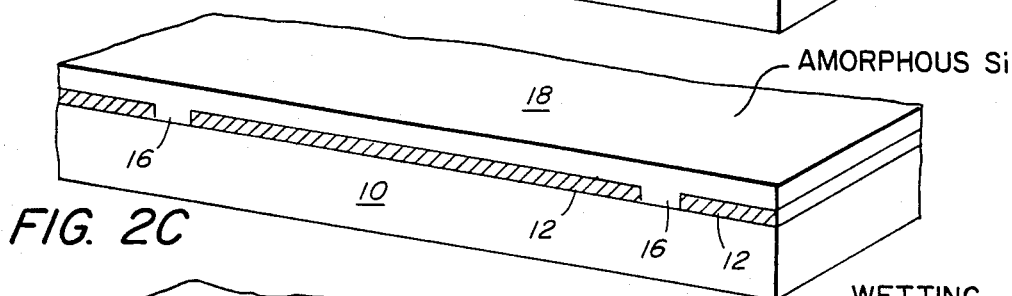

Next, as shown in FIG. 2C, a layer 18 of amorphous or polycrystalline semiconductor material, such as Si, is formed over the mask and extending into the stripes 14, as shown at 16, to contact the exposed single-crystal substrate 10. This layer may be formed by well known means such as by chemical vapor deposition.

Figure 2D:
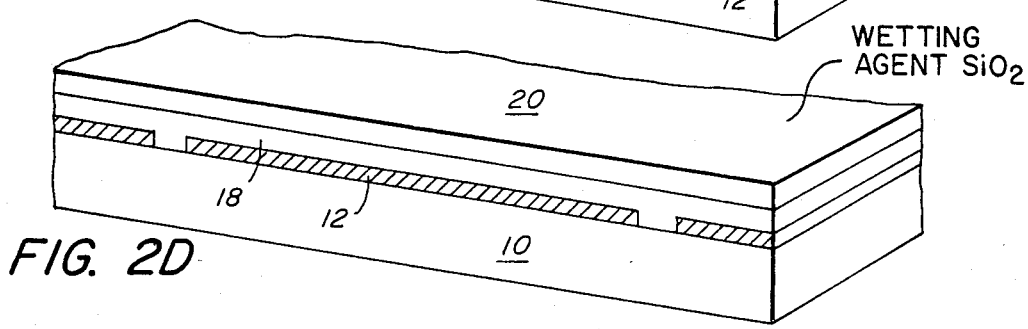

Finally, as shown in FIG. 2D, a second layer 20 of $SiO_2$, for example, is formed, such as by chemical vapor deposition or thermal oxidation, over the first amorphous Si layer. The structure shown in FIG. 2D is then subjected to a heat treatment as will be described in detail, which melts the silicon layer 18. The layer 18 then solidifies and single crystal growth is initiated from the interface 16 with the epitaxial substrate 10. In other words, epitaxial growth is "seeded" by substrate 10. This growth proceeds laterally from the interfaces 16 until the lateral growths meet to form a continuous layer.

Figure 3:
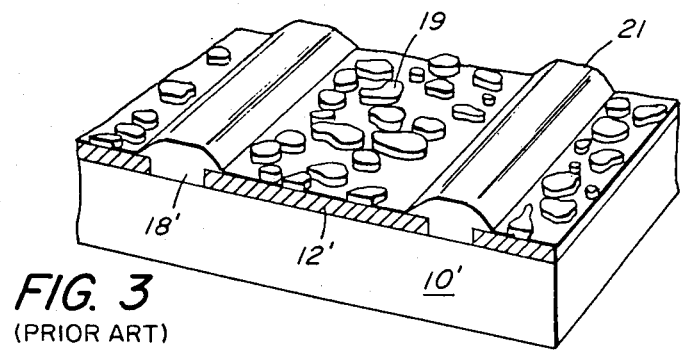
FIG. 3 presents a schematic illustrating a prior art structure made without a wetting agent layer.

The function of the second layer 20 may be appreciated after a consideration of FIG. 3 which shows in simplified form the problems encountered with the prior art CLEFT process. In the CLEFT process, no second layer 20 is used, thus when the amorphous silicon layer 18' is melted, the layer tends to agglomerate or "ball-up" as shown in schematic form in FIG. 3. In some cases, discontinuities are created between "balls" of material creating islands at 19 of amorphous or polycrystalline material resulting from the interruption of the seeded epitaxial growth from substrate 10. The initial growth at 21 is satisfactory since here the interface is between compatible surface structure, Si to Si, so no agglomerate occurs.

With the addition of a wetting agent layer 20 over layer 18, as in FIG. 2, such tendency to agglomerate has been minimized and substantially defect free lateral epitaxial growth has been repeatedly achieved. Depending on the selection of thermal treatment and other parameters, lateral growths in excess of 1 cm have been achieved and further extension is expected.

Apparatus for subjecting the sample prepared in accordance with the invention to an appropriate heat cycle will now be described in connection with FIG. 4.

Figure 4:
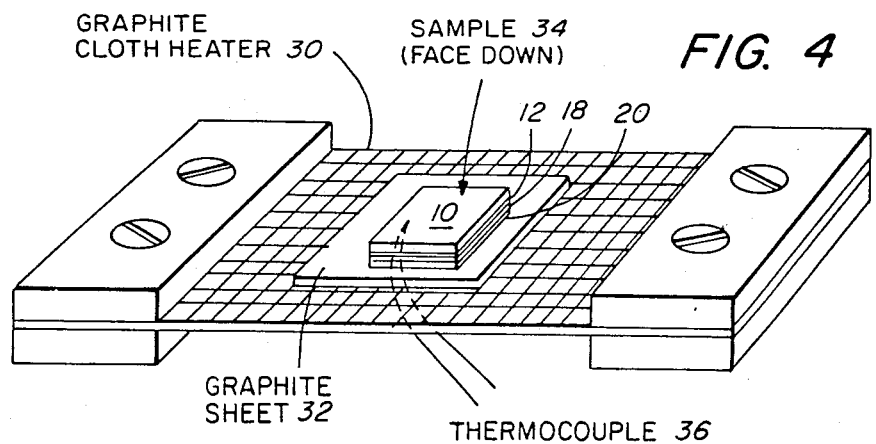
FIG. 4 presents a schematic perspective view illustrating a technique of this invention in simplified form, a stationary single heater embodiment for thermally heating a sample to produce lateral epitaxial growth from a crystallization substrate.
Figure 4A:
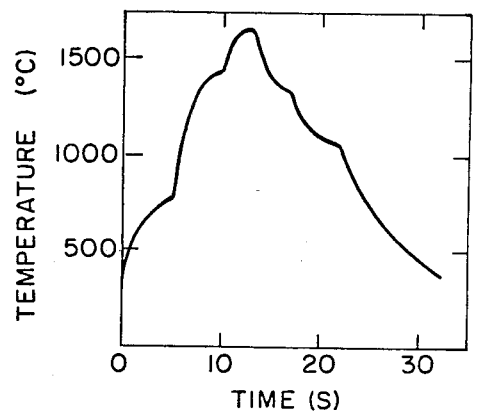
FIG. 4a is a plot which shows the thermal profile to which the sample in FIG. 4 is subjected.
Figure 4B:
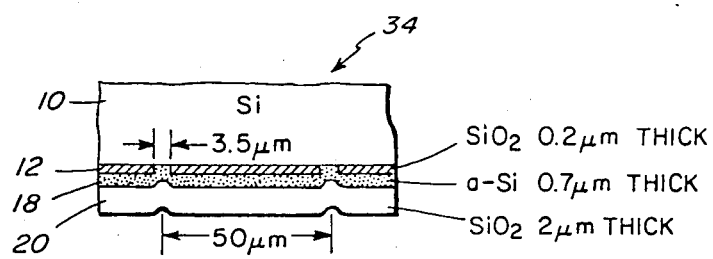
FIG. 4b is a schematicized cross-section of a portion of the sample in FIG. 4.

In the apparatus of FIG. 4, a $1 \times 2$ cm sample 34, an exploded section of which is shown schematically in FIG. 4b, cut from a wafer prepared in accordance with FIG. 2A–D having the following constituents and dimensions; is placed on a graphite cloth strip heater 30, with the Si substrate 10 facing down:

Si Substrate 10—5 cm diameter <100> wafer
$SiO_2$ Mask 12—0.2 micron thick formed by thermal oxidation
Amorphous Si 18—0.8–1.0 micron thick deposited in CVD reactor at 610° C.
$SiO_2$ Layer 20—2 micron thick CVD deposited at 625° C.
Stripes—3.5 microns wide and $\perp$ to the (110) plane opened in the mask 12 by photolithographic process.

A graphite sheet 32 about 2.5 cm by 2.5 cm is interposed between the cloth heater 30 and the sample to reduce surface morphology defects induced by the weave in the cloth heater. A thermocouple 36 is embedded in the cloth heater 30. The graphite sheet 32 is coated with an insulator ($Al_2O_3$) to prevent electrical current from passing through the sheet. The heating is performed in an inert gas (Argon) environment.

The thermal cycle profile, as measured by the thermocouple 36 is shown in FIG. 4a (which is a plot of the temperature in degrees Centigrade versus time in seconds.) The measured temperature is the temperature at the graphite cloth heater 30 and the actual sample temperatures may be different. Still, by maintaining this profile, repeatable results may be attained.

Excellent results have also been achieved using the two-step heater approach shown in FIGS. 5 and 6; in place of the single stationary heater described in connection with FIG. 4. FIG. 6 is a schematic diagram of the two-step heater apparatus. A device to be processed, sample 34, a portion of which is shown in the perspective FIG. 6, which has been made in accordance with the previous description; is placed on a lower strip heater 30 similar to the graphite heater described in connection with FIG. 4. The lower heater in energized by means (not shown) and brought to a temperature close to the melting point of silicon. Next, the upper strip heater 38, which is movable, in accordance with well known means not shown, is energized to induce melting of a strip zone 36 of silicon 18 underneath the SiO$_2$ layer 20. Next, the upper heater 38 is translated past the top surface of sample 34 to cause melting zone 36 to move in unison with the heater 38 to induce zone melting then solidification of the amorphous Si layer 18 to achieve lateral epitaxial growth transforming layer 18 into single crystal material.

For example, the lower graphite strip heater may be resistively heated to 1100°–1300° C. in about 20 seconds. The upper strip heater is then rapidly heated by applying power at a level of about 1 kW. Due to the additional heating of the sample 32 by radiation from this upper strip heater, in 20–40 seconds, a portion of the Si film 18 and a portion of the upper surface of the Si substrate 10 are melted in a narrow zone located below the narrow upper strip heater 38. The strip heater may then be manually moved over the sample 34 at a velocity of about 0.5 cm/sec. This rate should be slow enough for the molten zone to traverse the sample at the same rate, as determined by visual obseration. When the strip heater and molten zone reach the far end of the sample, the power to both heaters is switched off.

Figure 5:
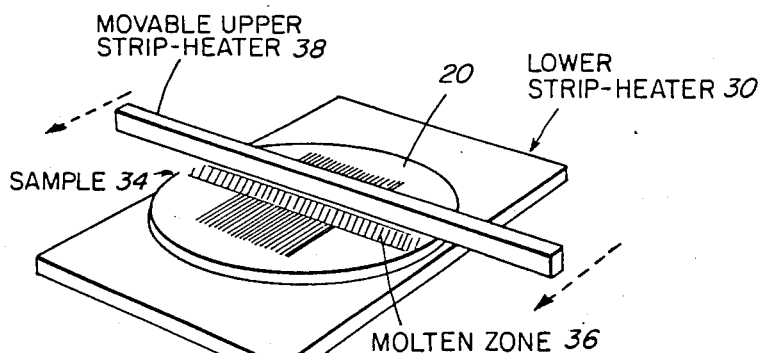
FIG. 5 is a perspective of a dual heater embodiment of the invention.
Figure 6:
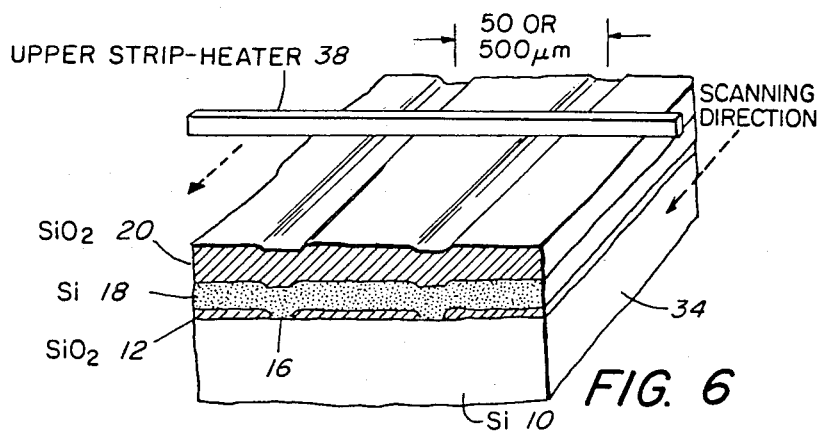
FIG. 6 is an exploded perspective showing the apparatus of FIG. 5 in more detail.
Figure 7:
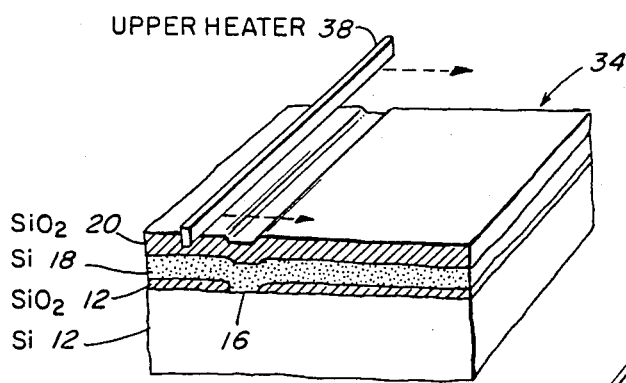
FIG. 7 is a perspective as in FIG. 6 except that the heater is located parallel to the stripe opening.

In the apparatus of FIGS. 5 and 6, the strip heater is scanned in a direction parallel to the stripe openings 16. In some applications, it may be desirable to scan in a direction perpendicular to a single opening 16 and grow a continuous sheet in one direction, as shown in FIG. 7; to avoid any problems associated with the intersection of two opposing growth fronts. In the apparatus of FIG. 7, the sample is brought close to the melting point of Si, by a lower heater (not shown). Melting is then induced at the single stripe opening 16 by the upper heater 38 which is aligned parallel to the opening and which moves in the direction of the arrows. Melting is induced in the stripe opening 16 and then solidification and epitaxial growth of layer 18 continues in the same direction, as the heater 38 traverses the surface of sample 34.

It should be noted that the apparatus of FIG. 7 results in a single continuous insulator over a substantial area underlying the single crystal and this is advantageous in the production of integrated circuits. The crystalline orientation of the growth layer 18 is determined by the orientation of the substrate 16. For example, if the substrate 16 is aligned in the (100) plane then the layer 18 will grow oriented in the (100) plane.

Figure 8:
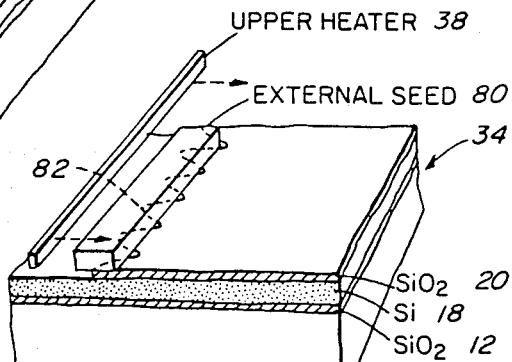
FIG. 8 is a schematic perspective view of an external seed embodiment which is suitable for growing sheets which are substantially single crystal.

FIG. 8 shows an external seed embodiment of the invention. In this embodiment no stripe 16 is required in insulative mask layer 12. Instead, there is a single continuous substrate 10. Since the substrate 10 is not used for seeding, it need not be a single crystal substrate but may be amorphous or polycrystalline silicon, or any suitable material for supporting a subsequent active semiconductor layer.

After the polycrystalline or amorphous Si layer 18 is formed on SiO$_2$ layer 12 by any of the many well known means, an SiO$_2$ layer 20 is formed on top of Si layer 18 to serve as a wetting agent layer, as previously described. However, at a convenient location on the surface of the top layer 20 of SiO$_2$, such as at the edge, a portion of layer 20 is removed leaving a convoluted edge 82 on the layer 20. An external seed 80 in the form of a volume of single crystal silicon is disposed on top of layer 20 so as to partly overlie the convoluted edge 82.

The sample 34 is heated up as in previous disclosed embodiments to a temperature near the melting point of silicon by a lower strip heater (not shown).

Next, the upper strip heater 38 is energized to bring the sample 34 to a temperature which will cause melting of the Si layer 18 in the zone adjacent to the heater 38. The convolutions at this edge permit the radiant energy from the heater 38 to more readily pass to the Si layer 18 beneath layer 20, thus making it easier to start melting laeyr 18. Next, the heater 38 is translated past the sample, in the direction of the arrows, by moving either the heater or sample with respect to one another. This causes the melted zone to move across the sample causing melting and solidification of layer 18. The layer 18 solidifies in a single crystalline state derived from external seed 80.

Figure 9:
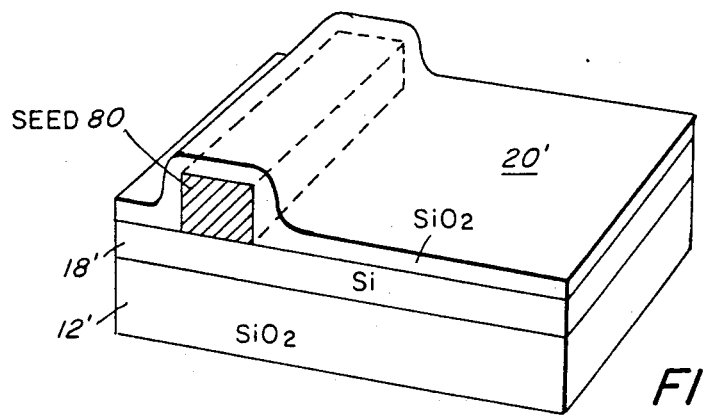
FIG. 9 is a schematic perspective view of an external seed embodiment with an overlayer of $SiO_2$.
Figure 10:
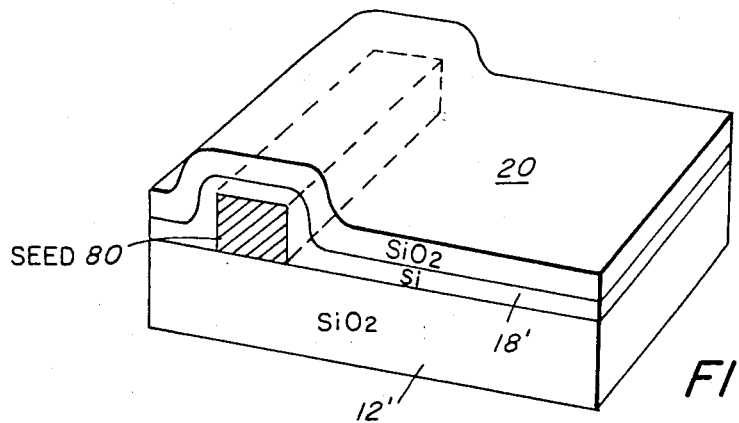
FIG. 10 is a schematic perspective view of an external seed embodiment with both the $SiO_2$ wetting agent layer and Si layer over the seed.

It should be noted that with an external seed, the necessity for the single crystal Si substrate is obviated. Accordingly, FIGS. 9 and 10, show alternative embodiments of an externally seeded lateral epitaxially grown structure on a insulative layer, such as SiO$_2$ layer 12'. In the FIG. 9 embodiment, the wetting agent layer 20 is formed over the seed after the seed 80 has been disposed on the amorphous Si layer 18'; so the entire seed is encapsulated. In FIG. 10, both the amorphous Si layer 18' and the SiO$_2$ wetting agent layer 20 are formed over the seed 80 after the seed has been placed on the SiO$_2$ insulating substrate 12'. It is to be understood that the samples described in FIGS. 9 and 10 are then subjected to a heat treatment as described in connection with the previous embodiments to convert the amorphous Si layer 18' to an epitaxial silicon layer seeded by single crystal seed 80.

In the apparatus thus far described, only a single wetting agent layer of SiO$_2$ has been utilized. In the embodiment shown in FIG. 11 an additional layer 40 of silicon nitride Si$_3$N$_4$ has been formed, such as by CVD, over the SiO$_2$ layer 20, In all other respects, the sample 42 is identical to the sample in FIG. 2D and is heat treated in the same fashion. The added Si$_3$N$_4$ layer appears to further enhance the wetting properties of the composite structure as compared to a single layer of SiO$_2$. This additional Si$_3$N$_4$ layer may be located as shown in FIG. 2D on top of the SiO$_2$ layer or it may be located below the SiO$_2$ layer adjacent the Si layer 18.

Figure 11:
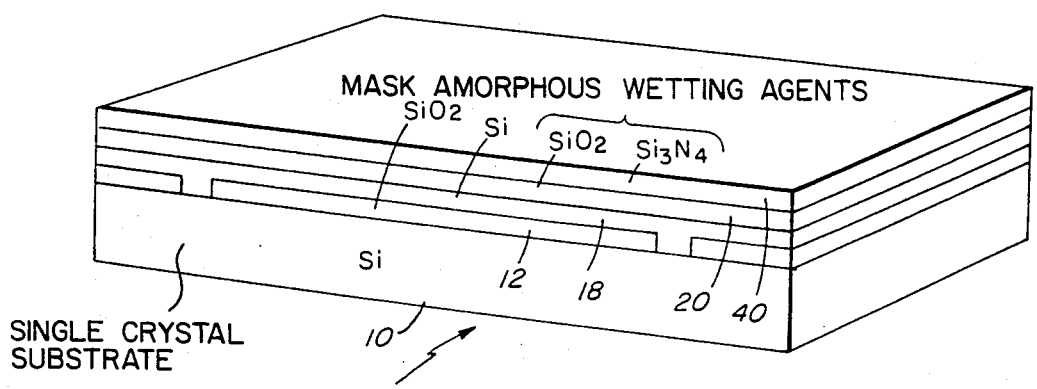
FIG. 11 is a schematic perspective view of a composite wetting agent embodiment.
Figure 11A:
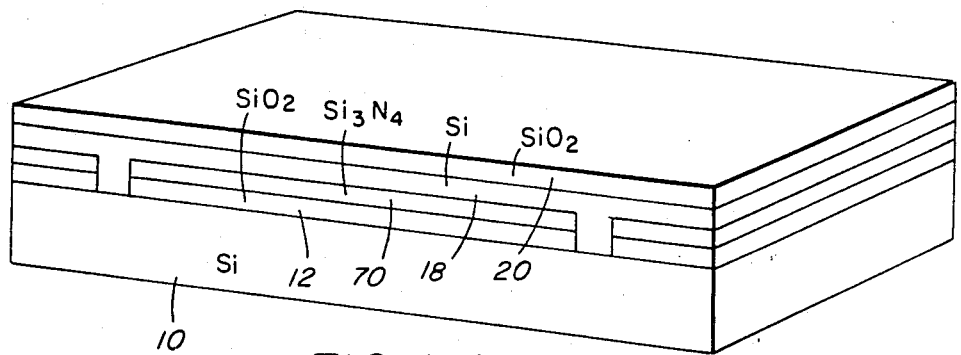
FIG. 11a is a schematic perspective view of an embodiment in which the wetting agent is located on the mask surface.

Optionally, it may be found desirable in some applications, to form the wetting agent on top of the SiO$_2$ insulating mask as shown in FIG. 11a, wherein parts corresponding to those in FIG. 11 are similarly numbered. Thus, there is shown in FIGS. 11a, a silicon substrate 10 of single crystal material from which is formed an oxide insulative mask of silicon dioxide 12 and on top of silicon dioxide mask 12 is formed a layer of silicon nitride which may serve as a wetting agent during the transformation of silicon amorphous or polycrystalline silicon layer 18 to an epitaxial crystalline layer.

The silicon nitride may be formed on layer 12 by any of the well known means, such as chamical vapor deposition, sputtering, etc.

On top of amorphous or polycrystalline silicon layer 18, a first wetting agent layer of silicon dioxide is formed as in previous embodiments. The sample, as shown in FIG. 11a, is then subjected to a heat treatment process, as previously described, which converts the amorphous or polycrystalline silicon layer 18 to an epitaxial silicon layer in accordance with the crystalline structure of silicon substrate 10 by lateral epitaxial growth from seeded solidification.

Figure 12A:
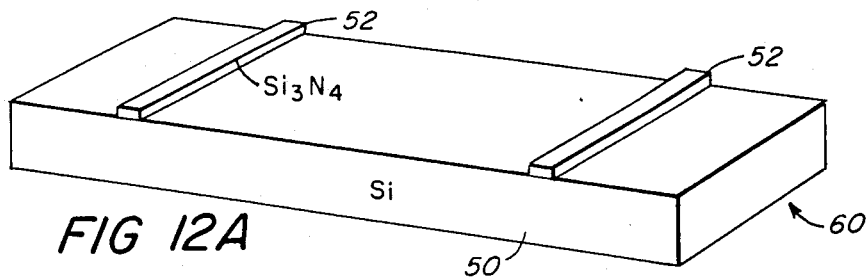
FIG. 12 A thru E is a series of schematic perspective views illustrating the steps in forming a planar embodiment of the invention.
Figure 12B:
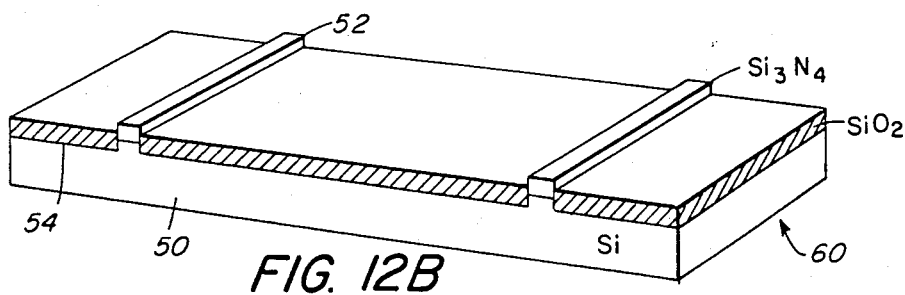
Figure 12C:
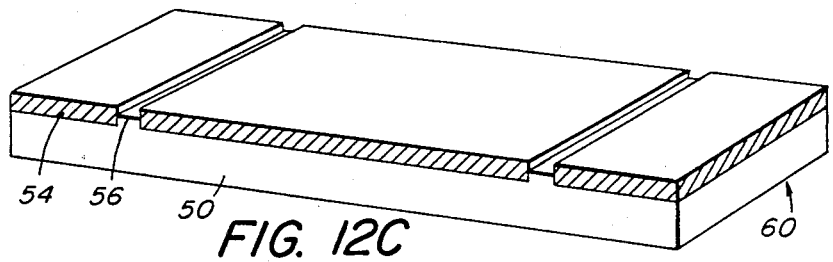
Figure 12D:
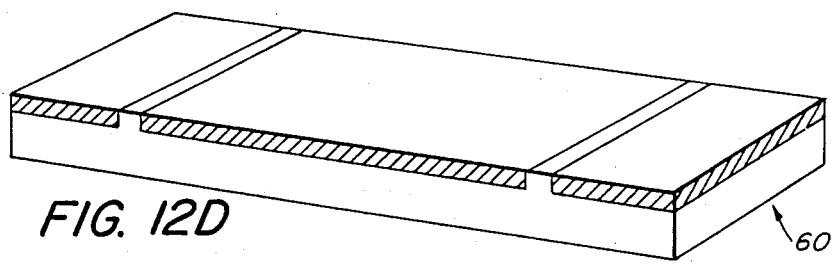
Figure 12E:
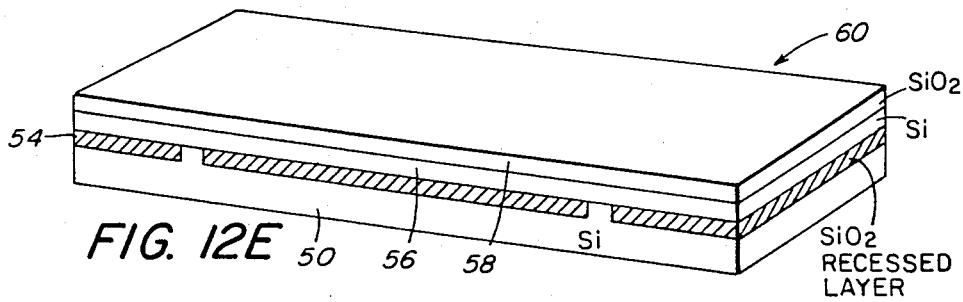

A recessed $SiO_2$ lateral epitaxy be seeded solidification embodiment is shown in FIGS. 12A–E. This produces a planar epitaxial structure as contrasted to prior embodiments which, although shown in planar fashion, actually form slight plateaus at the stripes where the epitaxial growth is initiated. In this embodiment, a stripe of silicon nitride 52 is formed by well known means on a single crystal silicon substrate 50 as shown in FIG. 12A. Next, the sample 60 is subjected to a thermal oxidation process to form a layer 54 of $SiO_2$ over the Si substrate 50 as shown in FIG. 12B. Then the $Si_3N_4$ is selectively etched by ion beam or chemical etching, leaving channels 56 of exposed Si between a layer 54 of $SiO_2$, as shown in FIG. 12C. Now the sample 60 is subjected to a surface etch to remove the oxide until the surface becomes flat as shown in FIGS. 12D. Finally, as shown in FIG. 12E, an amorphous Si layer 56 is formed on the sample 60 and a cap of $SiO_2$ 58 is formed over layer 56 to produce the planar structure shown in FIG. 12E. The sample is then ready for heat treatment as previously described, to convert the amorphous Si layer 56 to epitaxy.

In addition to the advantage of the planar epitaxial structure offered by the process and apparatus of FIG. 12, it should be noted that melting only has to proceed down to the top surface of $SiO_2$ layer 54 since the single crystal substrate interface is co-extensive with the top of the $SiO_2$ layer 54. This is in contrast to the FIG. 2 embodiment wherein the Si substrate interface is coextensive with the bottom of $SiO_2$ layer 12. Thus, less power can be employed. Also, there may be a lesser tendency for crystal defects to occur because the growth occurs at the planar surface rather than at the recessed surface of FIG. 2D.

Figure 13A:
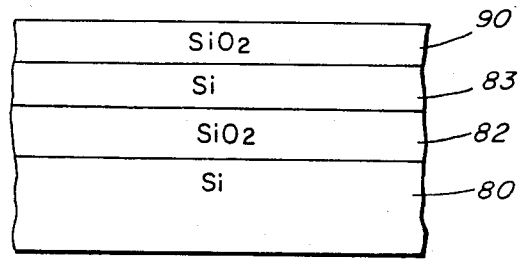
FIGS. 13A and 13B show the construction in partial schematic form of a three terminal semiconductor device fabricated on a $SiO_2$ substrate manufactured in accordance with the process described herein.
Figure 13B:
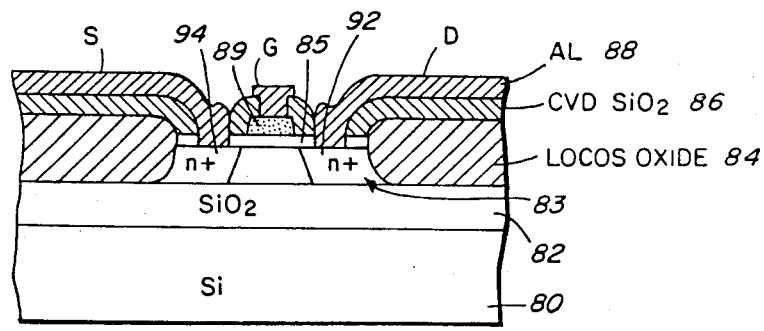

FIG. 13B shows a partial schematic of a three element semiconductor device fabricated on an $SiO_2$ substrate manufactured in accordance with the process described herein. The device of FIG. 13B is a MOSFET with LOCOS oxide isolation. MOSFET stands for Metal Oxide Semiconductor Field Effect Transistor. LOCOS stands for Local Oxidation of Silicon. A MOSFET is a well known device which is made in large quantities in the United States and elsewhere.

FIG. 13A illustrates how to form a MOSFET in accordance with the present invention. First a silicon substrate 80 of single crysatlline silicon is oxidized forming a silicon dioxide mask 82. A layer of amorphous or polycrystalline silicon material 83 is then formed on the $SiO_2$ mask 82 and wetting agent layer 90 of $SiO_2$ is formed on first layer 83. The amorphous or polycrystalline layer 83 is then transformed by heat treatment substantially to an epitaxial layer or film 83 in accordance with the previously described embodiments. The $SiO_2$ wetting agent layer is then removed, for example, by chemical etching.

Next, as shown in FIG. 13B, the active region 83 of the device is isolated from other active regions (not shown) by the LOCOS oxide 84 formed in a well known manner. A thermal oxide layer 85 is then formed on the surface of the active Si layer 83. A polysilicon gate 89 is formed by chemical vapor deposition on the oxide layer 85. This gate 89 is defined by photolithography and etching techniques. Windows are then opened on the gate oxide layer 85 for the introduction of suitable dopants by ion implantation into the source region 94 and drain regions 92 of the active regions 83. Finally, contacts for the source, gate and drain elements are formed by aluminum metallization.

It should be emphasized that the FIG. 13B device is only one of many type integrated circuit or semiconductor structures that could be formed using the process herein disclosed.

Figure 14:
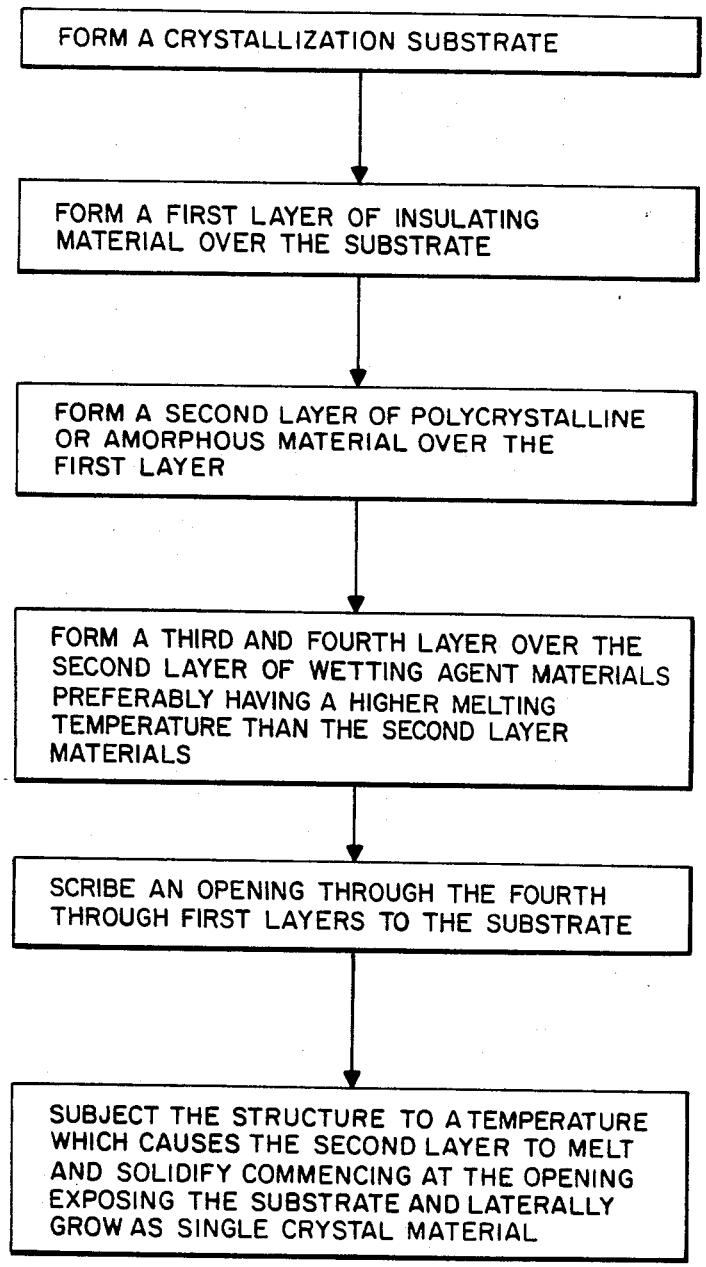
FIG. 14 is a process flow diagram of an alternate embodiment of a process in accordance with the invention.
Figure 15:
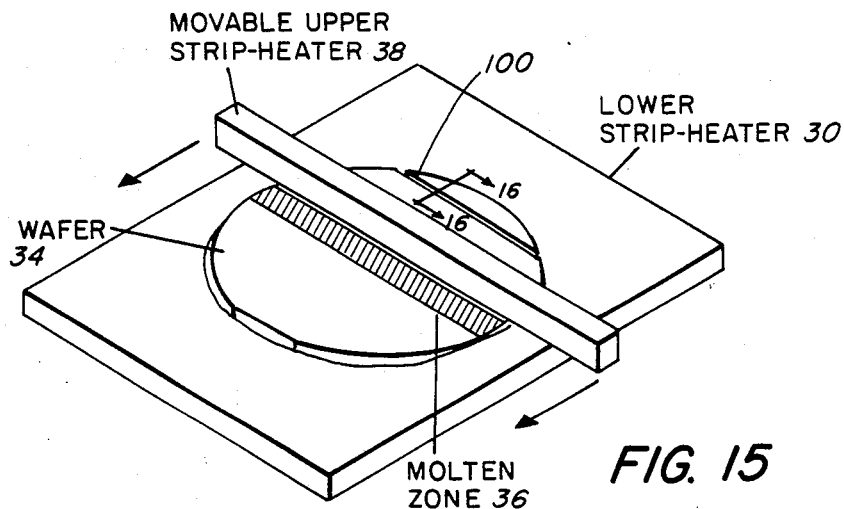
FIG. 15 is a perspective view of a further embodiment fo the invention utilizing a simplified scribing technique to induce seeded solidification.
Figure 16:
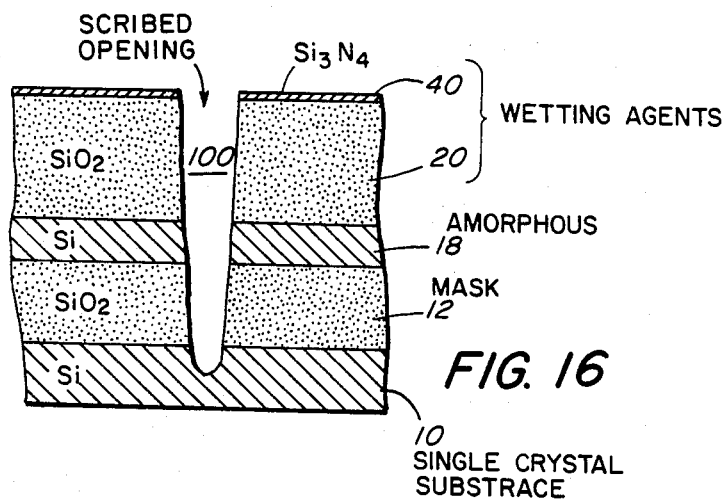
FIG. 16 is an enlarged partial cross-sectional view of FIG. 15 taken along lines 16—16.

Referring now to FIGS. 14–16, a further embodiment of the invention will be described which significantly differs from the previously described embodiments in that the layer being recrystallized does not have to be in physical contact with the crystallization seed during the commencement of the application of a melting temperature. In this embodiment of the invention, the process may be generally described as follows, as shown in FIG. 14.

First, a crystallization substrate is formed. This crystallization substrate may be substantially similar to the previously described single crystalline substrate of FIG. 10 of FIG. 2.

Next, an insulating layer, such as $SiO_2$, is formed over the entire substrate. There is no necessity to use chemical etching to provide openings in this insulating layer, such as those provide in layer 12 of FIG. 2B previously described. After the insulating first layer is formed over the substrate, a second layer of polycrystalline or amorphous material is formed by well known means on the insulating layer. This second layer is the layer that is to be recrystallized to form an epitaxial growth in accordance with the teachings of the invention. This layer may, for example, be amorphous silicon, such as the layer 18 described in connection with FIG. 2C. A third and fourth layer may then be formed over the second layer of a material preferably having a higher melting temperature than the second layer. These third and fourth layers are the wetting agent layers, previously described, and may comprise an $SiO_2$ layer followed by an $Si_3N_4$ layer. The end result is a structure such as that described previously in connection with FIG. 11, except that no openings are provided in the $SiO_2$ insulating layer 12.

The next step is to fabricate an opening through the first layer so that the crystallized portion of the substrate is exposed to the second layer. Preferably this may be done by mechanically scribing the sample down to the substrate. It should be noted that for ease in fabrication, mechanical scribing has been utilized for the preferred embodiment. However, the invention is not intended to be so limited and other means of forming openings, such as masking, etching, laser scribing, and other equivalents, are contemplated for use herein.

Next, the sample is subjected to a temperature which causes the second layer to melt and solidify, commencing at the opening to the substrate and laterally epitaxially growing a crystalline structure along the second layer of single crystal material.

As may be seen in FIG. 15, the process apparatus is very much similar to that described in connection with FIG. 5. A wafer 34, having a cross-sectional shape and construction, as shown in FIG. 16, and fabricated in accordance with the method of FIG. 14, is placed on a lower strip heater 30. The lower heater is energized by means (not shown) and brought to a temperature close to the melting point of the silicon.

Next, the upper strip heater 38, which is movable, in accordance with well known means (not shown), is energized to induce melting of a strip zone 36 of silicon 18 underneath the $Si_3N_4$ and $SiO_2$ layers 40 and 20, respectively.

Next, the upper heater 38 is translated pass the top surface of sample 34, commencing at or before the scribed area 100 to cause melting zone 36 to move in unison with the heater 38 to induce zone melting then solidification of the amorphous silicon layer 18, thereby achieving lateral epitaxial growth and transforming layer 18 into single crystal material.

Preferably, the heater apparatus is disposed in a stainless steel chamber with ports for access. The chamber may preferably be water cooled. The bottom graphite heater 30, in a typical application, is about 7 inches long by 4 inches wide and 0.04 inches thick. The upper heater is about 4.5 inches long by 0.04 inches wide and 0.1 inch thick. The wafer may be 2-3 inches in diameter and about 0.015 inches thick and rests in a circular depression of either 2 or 3 inches diameter and about 0.01 inch deep at the center of the lower heater 30 (as shown in FIG. 15). The upper heater should be located about 1 mm above the surface of wafer 34.

A computer controller motor (not shown), causes the upper heater to scan across the wafer. Both heaters are resistively heated by alternating currents of up to a few hundred amperes that are monitored and controlled by a microprocessor. Temperatures at the center and two edges of the wafer are monitored by well known thermocouples embedded in a lower heater. The silicon wafer 34, as shown in the cross-sectional view of FIG. 16, are single crystal <100> wafers 10 overcoated with a thermal $SiO_2$ layer about 1 micrometers thick, as indicated by the numeral 12.

A silicon film of 0.5 micrometers thick 18 is deposited by chemical vapor deposition over the entire $SiO_2$ and Si layers.

Next, a silicon nitrate and $SiO_2$ encapsulant is dpeosited by well known means on the silicon layer 18. The $SiO_2$ layer is labelled 20 and the $Si_3N_4$ layer is labelled 40. After the wafer is constructed, as above, an opening down to the single crystal substrate 10 is produced, preferably by mechanically scribing the wafer, as shown at 100 in FIGS. 15 and 16. The scribe may be either parallel to the <100> flat, as shown in FIG. 16, or it may be disposed 45° with the flat along the <100> plane. The scribe has been measured to be about 5-8 micrometers deep with a cross-sectional shape, as shown in FIG. 16.

The scribe opening allows the single crystal silicon substrate 10 to provide a convenient seed for the recrystallization of the amorphous silicon layer 18, as long as the zone-melting process in initiated from a surface of the wafer prior to the scribe opening. In other words, the zone-melting process should commence at or before the scribe opening 100 is reached. Then, as molten zone 36 reaches or occurs at the scribe opening 100, there is a certain amount of mass flow that moves down the scribe opening and upon solidification, the silicon substrate 10 is connected with the silicon film 18. Various geometries of scribe openings 100 have been found to be successful, including a semicircular scribe opening around the edge of the wafer, thereby allowing a larger area of the wafer to be seeded. Using this seeding technique, lateral epitaxial seeded solidification films of over 4 square inches have been obtained with no large angle grain boundaries.

Figure 17:
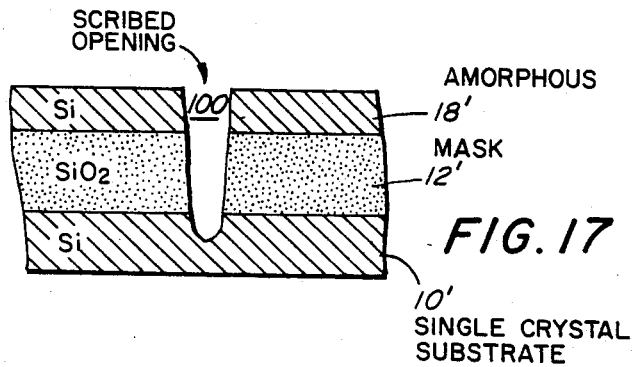
FIG. 17 shows an alternate embodiment in which capping layers are not utilized.

FIG. 17 shows an alternate embodiment in which the capping layers 40 and 20 are not utilized. Note like items between FIGS. 16 and 17 are correspondingly numbered with a prime suffix in FIG. 17. In the FIG. 17 embodiment, the scribed opening 100' need only pass through layers 18' and 12' to reach substrate 10'.

In summary, we have shown a method and apparatus for routine controllable recrystallization of Si films on $SiO_2$ coated silicon wafers of at least 3 inches in diameter.

The method and apparatus of FIGS. 14–16 has the advantage that the resultant structure is planar without resorting to the complex recess process described in connection with FIGS. 12A–E. Furthermore, if the scribing technique is used, it avoids the need for photolithography, as required in the apparatus of FIGS. 2A–D. Note that as with previous embodiments, it may be preferable to etch away the wetting agent layers 40 and 20 after the active Si epitaxial layer 18 has been formed, before further processing the body.

As stated earlier, the present processes and apparatus of any of the previously related embodiments is not limited to silicon. For example, gallium arsenide may be converted by this process from an amorphous or polycrystalline state to an epitaxial state. Suitable wetting agent films or layers for gallium arsenide are silicon dioxide $SiO_2$, silicon nitride $Si_3N_4$, or tungsten or molybdinum. Similarly, germanium may be converted from an amorphous or polycrystalline state to an epitaxial crystal film by the previously described process. In the germanium embodiment, a suitable wetting agent would comprise silicon nitride, molybdinum or tungsten.

Also, in addition to the previously mentioned wetting agents useful in connection with silicon, either carbon or silicon carbide may be found useful as wetting agents in connection with the conversion of silicon from polycrystalline to an epitaxial film.

In general, we have found that suitable wetting agents are those with a high enough melting point to avoid being melted during the transformation process, and which have limited interaction with the film being transformed but have sufficient enough interaction to serve as a "wetting agent" as heretofore defined.

EQUIVALENTS

There are many equivalents to the embodiments specifically described herein and such equivalents are intended to be covered by the following claims. For example, although amorphous or polycrystalline films or layers are referred to in many instances, the terms films and layers are meant to be interchangeable. Also, the seed material need not comprise the entire porton of the substrate but only the areas in contact with the films or layers being crystallized. Indeed, the seed need not be a part of the substrate, but may be formed in the film by local crystallization, such as, by local heat treatment. Additionally, the seed material need not be of identical composition with the material being crystallized. Thus, amorphous germanium may be seeded by single crystal silicon.

Furthermore, while growth has been shown as propagating laterally based on perpendicular movement of the heating source, with respect to the stripe opening, it may be advantageous in some applications to move the heating element in an oblique direction with respect to the stripe opening. The heating elements heretofore described have comprised graphite elements; however, electron beam, laser beam or other radiant sources are contemplated for use herein.

We claim:

1. A method of forming a semiconductor body comprising:
   (a) first, forming an insulating first layer over a crystallization substrate having at least one substantially single crystalline portion;
   (b) then, forming a second layer of amorphous or polycrystalline material over the first layer;
   (c) then, forming at least one opening through the first layer to expose said second layer to said portion of said substrate;
   (d) heating said layers to melt at least a portion of the second layer opposite said single crystal portion of said substrate to provide sufficient mass flow of the melted portion of the second layer through the opening to provide a crystalline influencing orientation contact with the single crystal portion; and
   (e) solidfiying the melted portion of the second layer to transform the melted portion of the second layer material to large grain substantially single crystal material, the crystallinity of said melted portion of the second layer being influenced by the crystallinity of the substrate at said orientation contacted single crystal portion.

2. The method of claim 1 wherein the layers are heated toot the melting temperature of the second layer by an adjacent graphite strip heater.

3. The method of claim 1 in which a first heater brings the body to a temperature slightly below the melting point of the second layer material and a second heater is translated across the surface of the body commencing at an area prior to the opening to bring a zone of material in said second layer to its melting point and translating such melted zone along said layer whereby lateral epitaxial growth of the material in said layer is achieved by seeded solidification from the crystallization substrate.

4. The process of claim 1 wherein said single crystal portion forms a nucleation region.

5. The method of claim 1 wherein said insulating first layer comprises silicon dioxide.

6. The method of claim 5 wherein said melting is performed with radiant energy.

7. A method of forming a semiconductor body comprising:
   (a) forming an insulating first layer over a crystallization substrate, said substrate being formed with regions of substantially single crystal material;
   (b) forming a second layer of amorphous or polycrystalline material over the first layer;
   (c) forming a third layer of wetting agent material means over said first and second layers for preventing agglomeration of said second layer when melted;
   (d) forming openings through said first layer to expose a portion of said substrate to said second layer at said regions;
   (e) heating at least said second layer to melt portions of the second layer exposed to said regions of substantially single crystal material to provide sufficient mass flow of melted material from the portions of the second layer to the region of the single crystal material to establish crystallization orientation contact therebetween;
   (f) solidifying the second layer to transform the wetted second layer material to large grain substantially single crystal material, the crystallinity of said transformed second layer material being influenced by the exposed crystallization substrate regions.

8. A method of claim 7 wherein the openings are scribed through the third layer to the regions.

9. A method of claim 7 wherein a fourth layer is formed adjacent said third layer to enhance the wetting properties of the combined third and fourth layers.

10. A method of claim 9 wherein the substrate is Si and the second layer is Si and the third and fourth layers are $SiO_2$, $Si_3N_4$, C or SiC.

11. A method of claim 7 wherein the first layer is $SiO_2$, the second layer is deposited Si, the third layer is $SiO_2$ and the substrate regions are single crystal Si.

12. The method of claim 11 wherein the third layer is removed after step (f).

13. A method of forming a layered semiconductor structure on a substrate body having at least one region of single crystal material covered by an intermediate material comprising:
   (a) forming a first layer of amorphous or polycrystalline material over said substrate but separated from said region of said substrate by said intermediate material;
   (b) providing an opening through said first layer and said intermediate material to the region of single crystal material in the substrate;
   (c) heating at least a portion of said first layer near said opening to melt the first layer portion and establish mass flow of said melted portion to said region of single crystal material and thereby establish orientation contact between said first layer and said region of single crystal material; and
   (d) solidifying the melted portion of the first layer to recrystallize the portion to large grain substantially single crystal material seeded by said single crystal substrate material.

14. The method of claim 13 including the step of
   (e) forming a second layer adjacent and in contact over a substantial portion of said first layer, said second layer comprising material adapted to serve as a wetting agent means for preventing agglomeration of said first layer during steps (c) and (d) and wherein the opening in step (b) extends through both the first and second layers.

15. A method of forming a semiconductor body comprising:
   (a) first, forming an insulating first layer over a crystallization substrate having at least one substantially single crystalline portion;
   (b) forming a second layer of amorphous or polycrystalline material over the first layer;

(c) then, forming at least one opening to expose said second layer to said single crystal portion of said substrate;

(d) after the opening is formed heating at least a portion of said second layer to melt a portion of the second layer to provide a sufficient orientation contact of the melted portion with the single crystalline portion; and (e) solidfiying the second layer to transform the melted second layer material to large grain substantially single crystal material, the crystallinity of said transformed second layer material being influenced by the crystallization of the substrate at said portion.

16. A method of forming a semiconductor body comprising:

(a) forming an insulating first layer over a crystallization substrate, said substrate being formed with regions of substantially single crystal material;

(b) forming a second layer of amorphous or polycrystalline material over the first layer;

(c) forming a third layer of wetting agent material means over said first and second layers for preventing agglomeration of said second layer when melted;

(d) sequentially forming openings through the third to and including the first layer to expose portions of said substrate at said regions todfyid second layer;

(e) then heating said layers to melt portions of the second layer exposed to said regions to provide a sufficient orientation contact of the melted portions with the regions;

(f) solidifying the second layer to transform the second layer material to large grain substantially single crystal material, the crystallinity of said second layer being influenced by the crystallization substrate regions.

17. A method of forming a layered semiconductor structure on a substrate having a least one region of single crystal material comprising:

(a) forming a first layer of amorphous or polycrystalline material over said substrate but separated from said region by an intermediate material;

(b) providing an opening through said intermediate material to expose said first layer to the region of single crystal material in the substrate;

(c) then heating said first layer to melt the first layer to form an orientation contact between the region and the first layer;

(d) solidifying the first layer to transform the layer material to large grain substantially single crystal material seeded by said region of single crystal material.

* * * * *

UNITED STATES PATENT AND TRADEMARK OFFICE
CERTIFICATE OF CORRECTION

PATENT NO. : 4,670,088
DATED : June 2, 1987
INVENTOR(S) : Bor-Yeu Tsaur, John C. C. Fan and Michael W. Geis It is certified that error appears in the above—identified patent and that said Letters Patent is hereby corrected as shown below:

Claim 2, line 2, change "toot" to ---to---.

Claim 16, part (d), line 3, change "todfyid" to ---to said---.

Signed and Sealed this

Thirteenth Day of October, 1987

Attest:

DONALD J. QUIGG

Attesting Officer

Commissioner of Patents and Trademarks